(12) United States Patent
Kautzsch et al.

(10) Patent No.: US 9,641,153 B2
(45) Date of Patent: May 2, 2017

(54) METHOD OF FORMING A RESONATOR

(71) Applicant: Infineon Technologies Dresden GmbH, Dresden (DE)

(72) Inventors: Thoralf Kautzsch, Dresden (DE); Heiko Froehlich, Radebeul (DE); Mirko Vogt, Dresden (DE); Maik Stegemann, Pesterwitz (DE); Thomas Santa, Seeboden (AT); Markus Burian, Villach (AT)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 14/932,303

(22) Filed: Nov. 4, 2015

(65) Prior Publication Data

US 2016/0126926 A1 May 5, 2016

Related U.S. Application Data

(63) Continuation of application No. 13/834,486, filed on Mar. 15, 2013, now Pat. No. 9,209,778.

(51) Int. Cl.
*H03H 9/24* (2006.01)
*H03H 9/02* (2006.01)
(Continued)

(52) U.S. Cl.
CPC ......... *H03H 9/2452* (2013.01); *B81B 3/0078* (2013.01); *B81C 1/00301* (2013.01);
(Continued)

(58) Field of Classification Search
CPC .............. H03H 9/02259; H03H 9/2452; H03H 3/0073; H03H 9/2463; H03H 2009/0233;
(Continued)

(56) References Cited

U.S. PATENT DOCUMENTS 6,930,364 B2 * 8/2005 Bruner ................ B81C 1/00246
257/414
7,352,040 B2 4/2008 Partridge et al.
(Continued)

FOREIGN PATENT DOCUMENTS

CN 102377408 A 3/2012

OTHER PUBLICATIONS

Office Action dated May 4, 2016 for Chinese Patent Application No. 201410087868.X.
(Continued)

*Primary Examiner* — Scott B Geyer
(74) *Attorney, Agent, or Firm* — Schiff Hardin LLP

(57) ABSTRACT

A method of forming a resonator by providing a first layer; forming a sacrificial layer on the first layer; forming a capping layer on the sacrificial layer; forming at least one etching aperture in the capping layer; forming at least one additional aperture having a different size than the at least one etching aperture; forming a cavity and releasing a resonator structure within the cavity by removing the sacrificial layer by etching via the at least one etching aperture; sealing the at least one etching aperture; and forming a lining in the at least one additional aperture.

19 Claims, 6 Drawing Sheets

(51) Int. Cl.
  *B81B 3/00* (2006.01)
  *B81C 1/00* (2006.01)
  *H03H 3/007* (2006.01)

(52) U.S. Cl.
  CPC ...... *H03H 3/0072* (2013.01); *H03H 9/02259* (2013.01); *B81B 2201/0271* (2013.01); *B81C 1/00158* (2013.01); *B81C 1/00246* (2013.01); *B81C 1/00396* (2013.01); *B81C 2203/0145* (2013.01); *H03H 3/0073* (2013.01); *H03H 9/2463* (2013.01); *H03H 2009/0233* (2013.01); *H03H 2009/02291* (2013.01); *H03H 2009/02307* (2013.01); *H03H 2009/02496* (2013.01)

(58) Field of Classification Search
  CPC .......... H03H 2009/02291; H03H 2009/02307; H03H 2009/02496; H03H 3/0072; H03H 9/24; H03H 9/02; H03H 3/007; B81B 2201/0271; B81B 3/0078; B81B 3/00; B81C 1/00158; B81C 1/00246; B81C 1/00396; B81C 2203/0145; B81C 1/00301; B81C 1/00
  See application file for complete search history.

(56) References Cited

U.S. PATENT DOCUMENTS

| | | | |
|---|---|---|---|
| 7,504,909 | B2 | 3/2009 | Tada |
| 7,898,148 | B2 | 3/2011 | Steeneken et al. |
| 7,993,950 | B2 | 8/2011 | Lacey et al. |
| 8,013,493 | B2 | 9/2011 | Van Der Avoort |
| 8,143,971 | B2 | 3/2012 | Beek et al. |
| 8,313,970 | B2 | 11/2012 | Quevy et al. |
| 8,593,230 | B2 | 11/2013 | Le Phan et al. |
| 2004/0113722 | A1 | 6/2004 | Bircumshaw et al. |
| 2009/0026882 | A1 | 1/2009 | Steeneken et al. |
| 2009/0275163 | A1* | 11/2009 | Lacey ................. B81C 1/00333 438/51 |
| 2010/0277262 | A1 | 11/2010 | Phan Le et al. |
| 2012/0032747 | A1 | 2/2012 | Vermeeren et al. |
| 2014/0054728 | A1* | 2/2014 | Maling ................. H01L 29/84 257/415 |

OTHER PUBLICATIONS

NXP MEMS Timing Devices Replace Crystal Oscillators, YouTube Video, Jan. 5, 2012, 2 pages.
Bontemps, "Design of a MEMS-based 52 MHz Oscillator," Sep. 21, 2009, 127 pages.
National Instruments Tutorial, "What is the ISO 26262 Functional Safety Standard?", Feb. 23, 2012, 4 pages.
NXP, "NXP Demonstrates Ultra-Compact, High-Precision MEMS Frequency Synthesizer," Jan. 9, 2012, 2 pages.

* cited by examiner

METHOD OF FORMING A RESONATOR

CROSS REFERENCE TO RELATED APPLICATION

This application is a continuation of U.S. patent application Ser. No. 13/834,486, which was filed Mar. 15, 2013. This application is incorporated herein by reference in its entirety.

TECHNICAL FIELD

The invention relates generally to microelectromechanical system (MEMS) resonators and more particularly to MEMS resonator structures which maximize a voltage supply.

BACKGROUND

Conventional digital circuitry typically relies on a quartz crystal to provide a clock signal. Quartz crystals, however, are bulky and do not provide suitable options for size reductions. As digital devices continue to shrink in size, the use of quartz crystals for timing becomes an impediment to further volume reductions.

Microelectromechanical system (MEMS) resonators have been identified as a possible replacement for the quartz crystal. MEMS resonators also present their own drawbacks, including that the silicon which the resonators comprise exhibits a temperature drift caused by a temperature-dependent linear expansion coefficient. While advancements in thermal stability have been made, other issues remain. For example, the drive voltage and constant bias voltage of a MEMS resonator are defined by the geometrical layout of the resonator structure, and conventional layouts do not allow for the maximum voltage on-chip to be used as the bias voltage.

Challenges also exist in manufacturing MEMS resonators, particularly in integrating resonators as part of conventional CMOS processing. MEMS resonators often are provided as part of "system-in-package" products along with microchips and other related structures and components to which the resonators can provide a resonant frequency used in operation. Resonator structures as part of system-in-package configurations must be taken into consideration in package design and system production. For example, compatibility with CMOS (complementary metal-oxide-semiconductor) processing can be important as direct integration of resonator fabrication as part of CMOS processes can provide cost savings that make MEMS resonators more attractive.

In CMOS processing, the resonator can be encapsulated in a vacuum, with sealing or capping provided a silicon capping wafer in one embodiment, or by forming the cavity for the resonator using a sacrificial layer etch. The dimensions of the cavity and the techniques used to free the resonator within the cavity such that it can resonate are important considerations when considering compatibility with CMOS process integration. For example, if a resonator cavity is to have a clearance above the resonator structure of about 1 µm, use of conventional back-end CMOS processing techniques becomes impractical, as a wet chemical etch is often used to form the cavity but a minimum cavity height is required to prevent the resonator from adhering or bonding with the capping layer. This minimum height combined with a relatively thick ceiling (e.g., about 2-3 µm in embodiments) which seals the cavity increases the size of the resonator structure beyond what is practical and/or desired.

SUMMARY

In an embodiment, a microelectromechanial system (MEMS) resonator comprises a first drive electrode; a resonator structure having a first end spaced apart from the first drive electrode by a first gap; and a ground electrode electrically coupled to the first end of the resonator.

In an embodiment, a method of forming a resonator comprises providing a first layer; forming a sacrificial layer on the first layer; forming a capping layer on the sacrificial layer; forming at least one etching aperture in the capping layer; forming a cavity and releasing a resonator structure within the cavity by removing the sacrificial layer by dry etching via the at least one etching aperture; and sealing the at least one etching aperture.

BRIEF DESCRIPTION OF THE DRAWINGS

The invention may be more completely understood in consideration of the following detailed description of various embodiments of the invention in connection with the accompanying drawings, in which.

Figure 1:
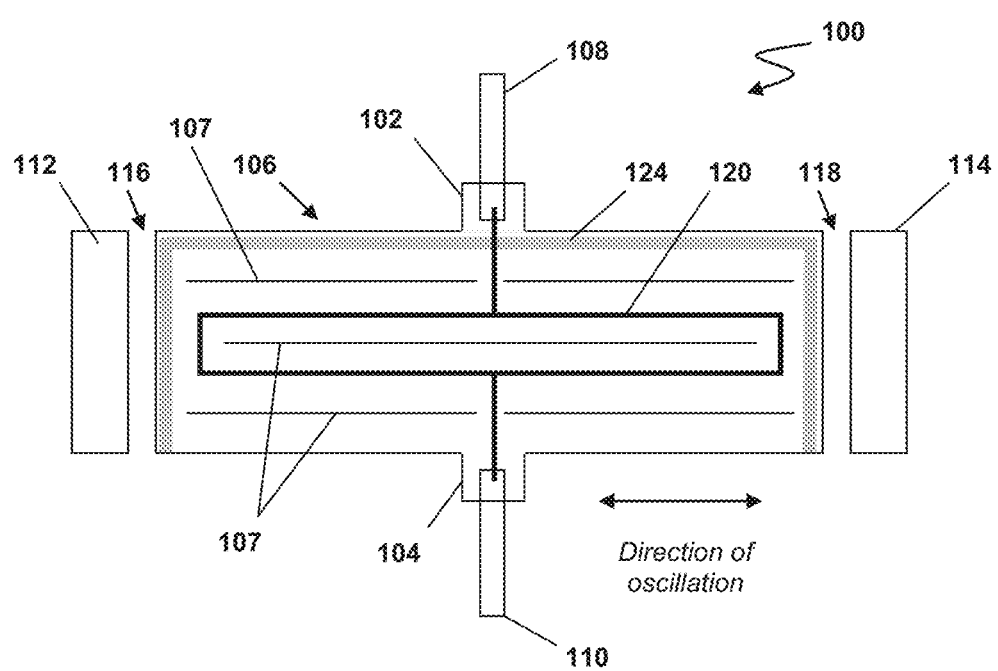
FIG. 1 depicts a resonator structure according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to MEMS resonator structures and methods that enable application of a maximum available on-chip voltage. In an embodiment, a MEMS resonator comprises a connection between a ground potential and the gap electrode of the resonator. Embodiments also relate to manufacturing systems and methods that are less complex and enable production of MEMS resonators of reduced dimensions.

Referring to FIG. 1, a resonator 100 according to an embodiment is depicted. In embodiments, resonator 100 comprises a free-free beam MEMS piezoresistive resonator structure anchored by anchors 102 and 104 such that the beam structure 106 is configured to resonate longitudinally, i.e., side-to-side lengthwise in the direction indicated by the arrow, in operation. Resonator 100 can comprise a "dog bone" resonator structure, or some other suitable resonator structure in other embodiments. In other words, the particular shape, layout, dimensions, and other characteristics of resonator 100 can vary from those specifically depicted in the example illustration of FIG. 1, as appreciated by those skilled in the art.

Beam structure 106 also can comprise one or more slits or trenches 107. Trenches 107 can be arranged on beam structure 106 to direct or concentrate current flow within beam structure 106. The particular size, arrangement and configuration of trenches 107 can vary from those depicted in FIG. 1. For example, in other embodiments, the center trench can be wider than the trenches on the top and bottom (as oriented on the page of the drawing), or the top and bottom trenches can be shorter such that they do not extend as close to the ends of beam structure 106 or toward the center. Multiple trenches 107 also can be formed, in parallel or in series with other trenches. Other characteristics of one or more of trenches 107 also can vary in other embodiments.

As depicted, resonator 100 comprises a ground electrode 108, a sense electrode 110, and two drive electrodes 112 and 114. A gap or trench 116 and 118 separates each drive electrode 112 and 114, respectively, from beam structure 106. In embodiments, resonator 100 comprises silicon and can comprise doped silicon and/or a doped region 120 that forms a piezoresistor in beam structure 106. For example, in one embodiment the bulk of beam resonator structure 106 can comprise p-doped silicon, while doped region 120 can be n-doped, or vice-versa in another embodiment.

In operation, when a bias voltage is applied to drive electrodes 112 and 114, excitation of resonator 100 occurs such that beam structure 106 resonates or oscillates between electrodes 112 and 114, anchored by anchors 108 and 110. In embodiments, the bias voltage comprises both DC and AC components, such as a larger DC component (e.g., in a range of about 1V to about 20V, or less or more in embodiments) and a smaller AC component (e.g., about 100 mV, or less or more in embodiments). A sensing voltage is also applied between electrodes 108 and 110 such that current flows along a path generally defined in the structure of resonator 100 including trenches 107, i.e., within doped region 120, and a change in the resistance of beam structure 106 due to the piezoresistive effect can then be sensed.

The bias and sensing voltages are related in embodiments to the geometrical layout of resonator 100. In a capacitively excited resonator, the width of gaps 116 and 118 between the ends of beam structure 106 and each drive electrode 112 and 114 generally should be small, on the order of about 100 nanometers (nm) or less in embodiments, which functions to reduce the bias voltage necessary to drive resonator 100. For gap widths significantly less than 100 nm, the DC bias voltage is on the order of about 1V to about 3V in embodiments. Additionally, it can be advantageous to maximize the bias voltage, such as by making it equal to the maximum available voltage, or the maximum voltage available on-chip. This can eliminate the need to use charge pumps, voltage conversion or other techniques.

This can be accomplished in embodiments by providing a coupling region between ground electrode 108 and drive electrodes 112 and 114, which in FIG. 1 is provided by a highly doped implant region 124. Region 124 is configured to provide the potential of ground electrode 108 at the ends of beam resonator structure 106 opposite each drive electrode 112 and 114. In other words, region 124 can provide an electrode-ground short that can maximize a voltage difference therebetween to more efficiently drive resonator 100 and use the maximum available on-chip voltage as the bias voltage in operation.

Thus, in one example without region 124, a DC voltage of 5V is available on-chip. If 3V are applied between sense electrode 110 and ground electrode 108, then 3.5V are available across gaps 116, 118 to drive resonator 100 given the ground potential at the ends of beam resonator structure 106. In another example without region 124, if a DC voltage of 3V is available and 3V are applied between sense electrode 110 and ground electrode 108, then 1.5V are available across gaps 116 and 118. Thus, without region 124 providing a short between ground electrode 108 and drive electrodes 112, 114, only a portion of the available voltage (e.g., 3.5V vs. 5V, and 1.5V vs. 3V, in the previous examples) is used as the DC bias voltage to drive resonator 100. Contrarily, when an electrode-ground short is provided by region 124, the maximum available voltage (e.g., 5V and 3V in the previous examples) can be used to drive resonator 100.

Figure 2:
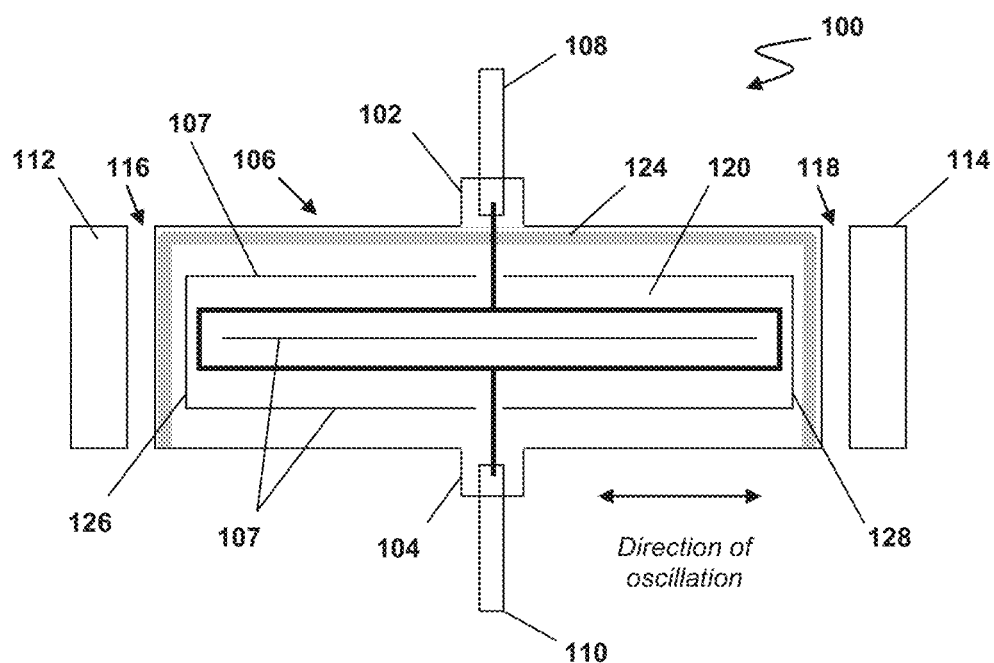
FIG. 2 depicts a resonator structure comprising additional trenches according to an embodiment.

Referring to FIG. 2, in another embodiment the isolation between the ends of the piezoresistor, or region 120, and the ground potential of region 124 can be improved by providing additional trenches 126 and 128 therebetween. If the tips of region 120 are shorted to ground by region 124, the resistance swing is reduced by half. Trenches 126 and 128, on the other hand, keep the capacitive coupling between the ground potential of region 124 and the piezoresistor of region 120 low. In other embodiments, trenches 126 and 128 can be supplemented or replaced by low- or counter-doped regions between region 120 and region 124. Trenches 126 and 128 need not connect or align with some or all of trenches 107 as depicted in FIG. 2. In other embodiments, trenches 126 and 128 can be spaced apart from the ends of one or more of trenches 107, or trenches 126 and 128 can meet but extend beyond the ends of trenches 107. In other embodiments, trenches 126 and 128 as well as trenches 107 can be filled with a dielectric material, a composite filler comprising a dielectric material, or some other suitable material. Other configurations are possible in other embodiments as well.

As previously mentioned, the particular layout and configuration of resonator 100 can vary in other embodiments. For example, the arrangement and configuration of trenches 107, 126 and 128 can vary according to other characteristics of resonator 100. Additionally, the particular size, arrangement and configuration of region 124 can vary, though the principle of providing a coupling arrangement between a ground potential and the tips of a resonator structure at a gap between the resonator and one or more drive electrodes remains. More or fewer electrodes can be present, and the particular arrangement and characteristics of the various electrodes can vary from those depicted in FIGS. 1 and 2. If additional electrodes are present in embodiments, the additional electrodes also can be coupled to the ground electrode as discussed herein, or not, as can be suitable for any particular embodiment as appreciated by those skilled in the art.

In embodiments, novel processes also can be implemented to avoid the previously mentioned drawbacks associated with integrating resonators in system-in-package and other configurations and using CMOS and other techniques. In embodiments, a dry-etchable sacrificial layer can be used along with a capping layer and/or layer sequence which provides a minimal structural height, such that the overall process can be simplified, and therefore is less expensive, while also providing a resonator structure with reduced dimensions. The processes discussed herein are suitable, for example, for fabricating resonator structures such as those discussed herein with reference to FIGS. 1 and 2.

Figure 3:
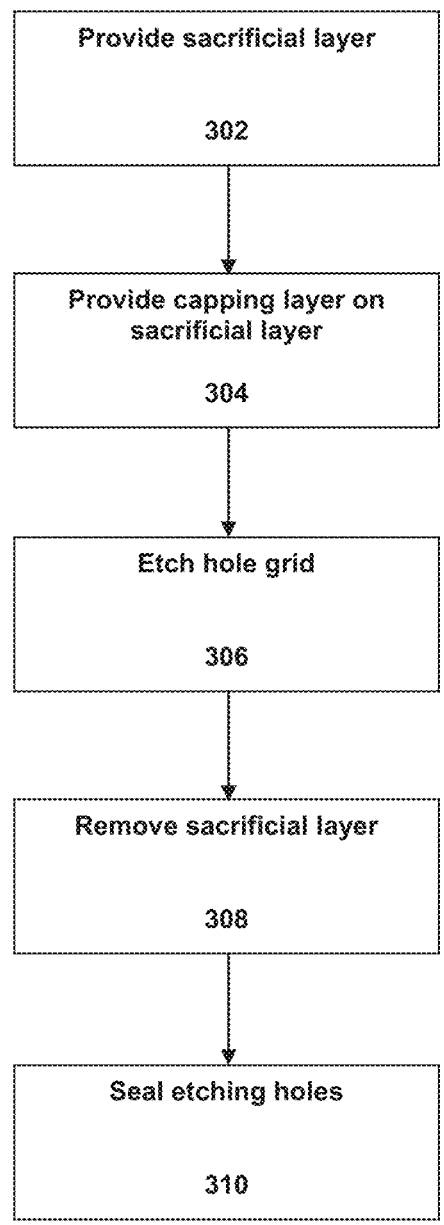
FIG. 3 depicts a process flowchart according to an embodiment.
Figure 4A:
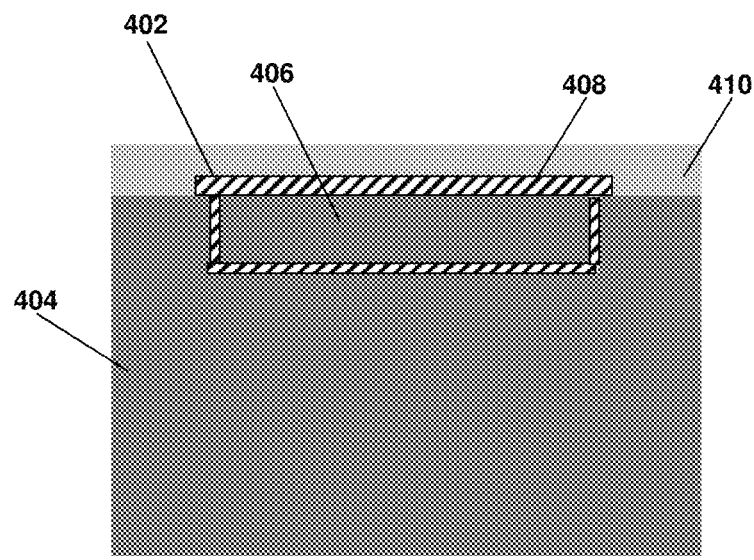
FIG. 4A depicts a process stage of a resonator according to an embodiment.

Referring to FIGS. 3 and 4A, a sacrificial layer 402 is formed on top of the resonator structure or surrounding the resonator structure in and/or on a silicon layer 404 at 302. In embodiments, the sacrificial layer 402 comprises carbon and, once removed, will free a resonator 406 to resonate within a cavity 408. Sacrificial layer 402 is capped with a capping layer 410 at 304.

Figure 5:
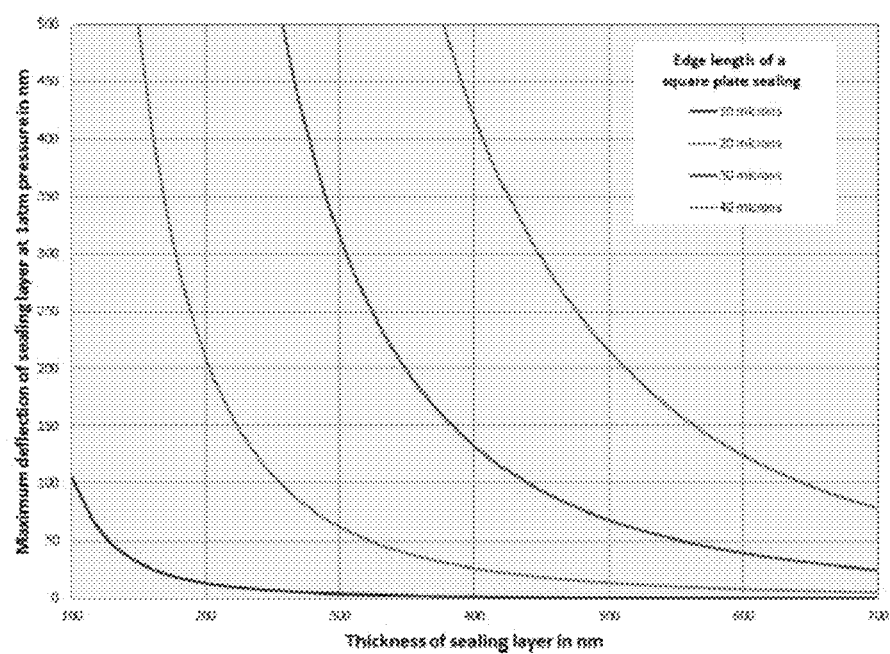
FIG. 5 depicts a graph of layer deflection for various layer thicknesses according to an embodiment.

Capping layer 410 can comprise a dielectric in embodiments, such as oxide or nitride. A thickness of capping layer 410 is chosen in embodiments such that it corresponds to a typical thickness of an intermediate layer, such as oxide, used in the CMOS process. The thickness of capping layer 410 also should take into consideration the pressure it will have to withstand without flexing or other deformation. In embodiments in which capping layer 410 comprises nitride, for example, the inventors have found that flexure of less than about 250 nm occurs at a pressure of one atmosphere if capping layer is about 500 nm thick or more, even for relatively large cavities of up to about 40 µm wide. Refer, for example, to FIG. 5, which depicts the maximum deflection of capping layers of various thicknesses for various edge lengths being capped. The thickness of capping layer 410 can vary in other embodiments, for example if a material other than nitride is used, the capping layer or resonator has some different structural features, or according to other characteristics. For example, in various embodiments capping layer 410 can be less than about 1 µm thick, such as less than about 0.5 µm thick in one embodiment.

Figure 4B:
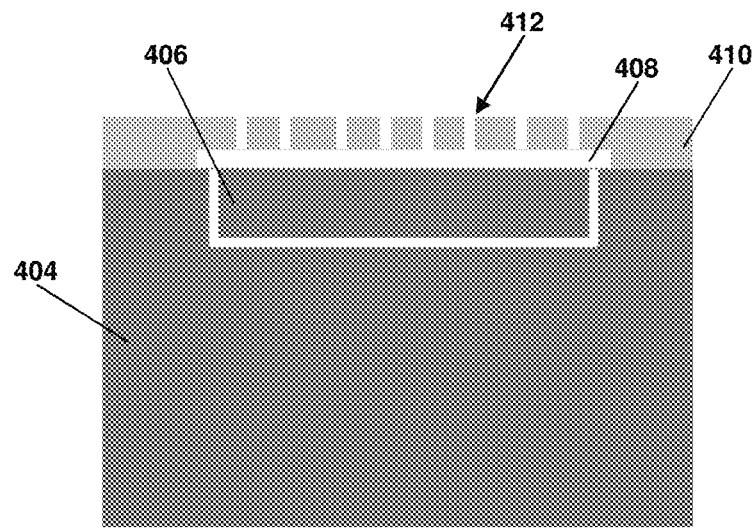
FIG. 4B depicts another process stage of a resonator according to an embodiment.

At 306, an etching hole grid or other apertures 412 are etched in capping layer 410, and at 308 sacrificial layer 402 is removed. In embodiments, sacrificial layer 402 can be removed by a plasma etching process or some other suitable dry etching process. The use of plasma or other dry etching techniques enables cavity 408 to be kept thin as there is less chance of adhesion between resonator 406 and capping layer 410. After removal of sacrificial layer 402, the structure as depicted in FIG. 4B remains.

Figure 4C:
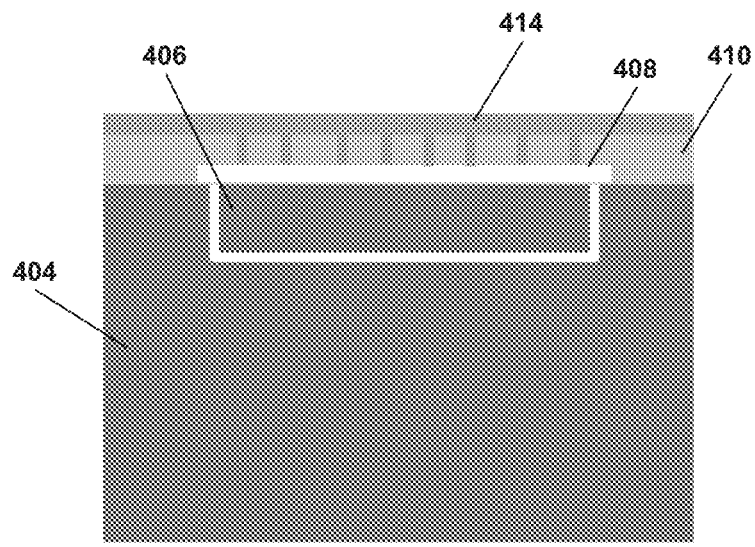
FIG. 4C depicts another process stage of a resonator according to an embodiment.

Referring to FIG. 4C, etching hole grid 412 can be sealed by a fill layer 414 at 310. In embodiments, fill layer 414 can comprise oxide or some other dielectric and can be available as a planar dielectric for use as an intermediate oxide in the metallization module or for other purposes.

Figure 6A:
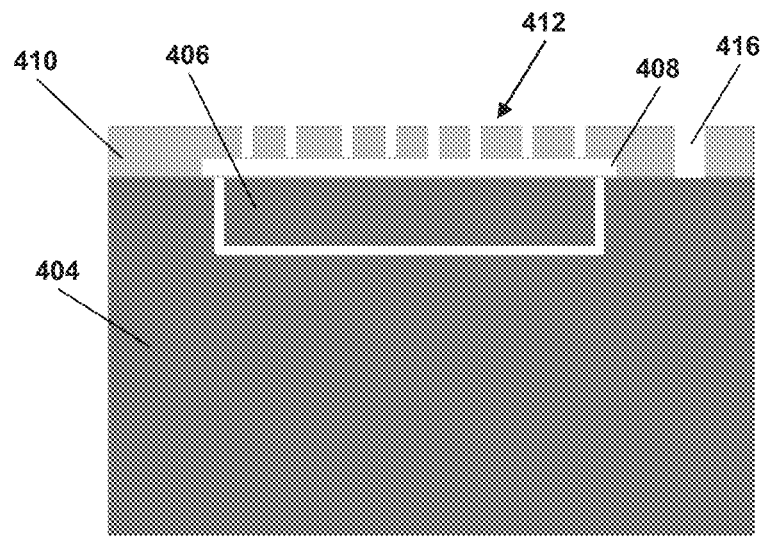
FIG. 6A depicts a process stage of a resonator according to an embodiment.
Figure 6B:
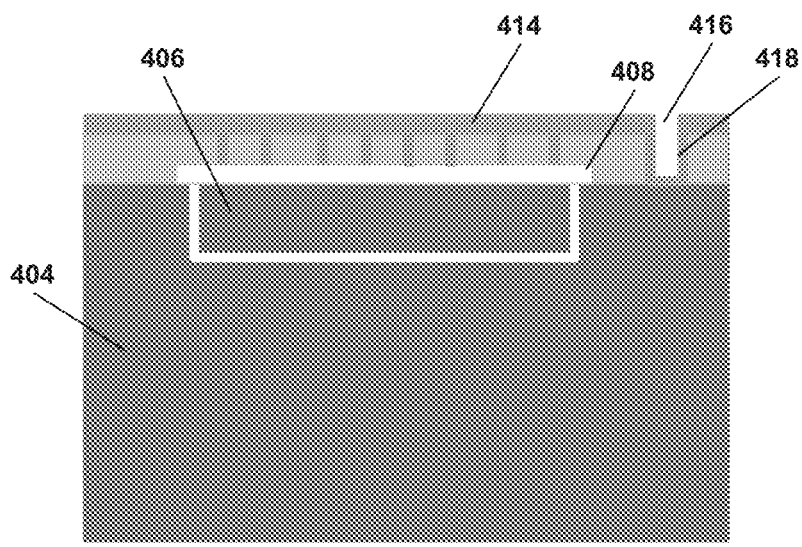
FIG. 6B depicts another process stage of a resonator according to an embodiment.

In another embodiment, and referring to FIGS. 6A and 6B, the dimensions and placement of one or more of etching holes 412 or other apertures can vary. For example, in FIG. 6A one aperture 416 is spaced apart from cavity 408 and is larger than etching holes 412 such that aperture 416 can later comprise a contact or other circuit element. When fill layer 414 is deposited, etching holes 412 are sealed while a lining 418 is formed in aperture 416. Lining 418 can be partially or fully removed in later processing, if desired. Thus, joint patterning of etching holes and apertures for encapsulating resonator structures and contact holes is possible, providing reduced process costs and complexities.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112 sixth paragraph of 35 U.S.C. are not to be invoked unless the specific terms "means for" or "step for" are recited in a claim.

What is claimed is:

1. A method of forming a resonator comprising:
   providing a first layer;
   forming a sacrificial layer on the first layer;
   forming a capping layer on the sacrificial layer;
   forming at least one etching aperture in the capping layer;
   forming at least one additional aperture having a different size than the at least one etching aperture;
   forming a cavity and releasing a resonator structure within the cavity by removing the sacrificial layer by etching via the at least one etching aperture;
   sealing the at least one etching aperture; and
   forming a lining in the at least one additional a aperture.

2. The method of claim 1, wherein forming the capping layer further comprises forming a capping layer having a thickness of less than about 10 micrometers.

3. The method of claim 2, wherein the capping layer has a thickness of less than about 500 micrometers.

4. The method of claim 2, wherein forming a cavity and releasing a resonator structure within the cavity by removing the sacrificial layer further comprises using a plasma etch via the at least one etching aperture.

5. The method of claim 2, wherein the first layer comprises silicon.

6. The method of claim 2, wherein the sacrificial layer comprises carbon.

7. The method of claim 2, wherein the capping layer comprises one of oxide or nitride.

8. The method of claim 1, wherein sealing the at least one etching aperture further comprises depositing a dielectric layer.

9. The method of claim 1, further comprising removing at least a portion of the lining from the at least one additional aperture.

10. The method of claim 9, further comprising using the at least one additional aperture as a contact.

11. The method of claim 1, wherein forming the capping layer further comprises forming a capping layer having a thickness of less than about 1 micrometer.

12. The method of claim 1, wherein forming the capping layer further comprises forming a capping layer having a thickness of less than about 0.5 micrometer.

13. The method of claim 1, wherein forming the at least one etching aperture in the capping layer further comprises forming an etching aperture grid in the capping layer.

14. The method of claim 13, wherein the sealing further comprises sealing the etching aperture grid with a fill layer.

15. The method of claim 14, wherein the fill layer comprises oxide.

16. The method of claim 1, wherein removing the sacrificial layer by etching comprises removing the sacrificial layer by dry etching.

17. The method of claim 1, wherein the at least one additional aperture is spaced apart from the cavity and is larger than the at least one etching aperture.

18. The method of claim 1, further comprising:
removing fully the lining from the at least one additional aperture.

19. The method of claim 1, wherein the lining is formed in the at least one additional aperture while the at least one etching aperture is sealed.

* * * * *